(12) United States Patent
Ma

(10) Patent No.: US 8,815,344 B2
(45) Date of Patent: Aug. 26, 2014

(54) SELECTIVE ATOMIC LAYER DEPOSITIONS

(75) Inventor: Paul F. Ma, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 157 days.

(21) Appl. No.: 13/420,146

(22) Filed: Mar. 14, 2012

(65) Prior Publication Data

US 2013/0243956 A1 Sep. 19, 2013

(51) Int. Cl.
*C23C 16/06* (2006.01)
*C23C 16/455* (2006.01)

(52) U.S. Cl.
USPC .............. 427/255.28; 427/255.394; 117/84; 117/88

(58) Field of Classification Search
USPC ............... 427/255.28, 255.394; 117/84, 88
See application file for complete search history.

(56) References Cited

U.S. PATENT DOCUMENTS

| | | | |
|---|---|---|---|
| 2002/0182320 A1* | 12/2002 | Leskela et al. | 427/250 |
| 2003/0124262 A1* | 7/2003 | Chen et al. | 427/404 |
| 2005/0182320 A1* | 8/2005 | Stifter et al. | 600/429 |
| 2006/0013943 A1* | 1/2006 | Chen et al. | 427/58 |
| 2007/0251445 A1* | 11/2007 | Ishizaka | 117/92 |
| 2008/0038463 A1* | 2/2008 | Chen et al. | 427/255.28 |
| 2008/0199601 A1* | 8/2008 | Gonohe et al. | 427/126.1 |
| 2008/0242082 A1 | 10/2008 | Yang et al. | |
| 2009/0142491 A1* | 6/2009 | Nakamura et al. | 427/255.7 |
| 2009/0202710 A1* | 8/2009 | Marcadal et al. | 427/126.1 |
| 2010/0215842 A1* | 8/2010 | Chen et al. | 427/96.8 |
| 2011/0318505 A1* | 12/2011 | Yamamoto et al. | 427/569 |

OTHER PUBLICATIONS

Burton, B.B., et al., "Tantalum Nitride Atomic Layer Deposition Using (tert-Butylimido)tris(diethylamido)tantalum and hydrazine". Journal of the Electrochemical Society, 155 (7) D508-D516 (2008).*
Leskela, Markku, et al., "Atomic layer deposition (ALD): from precursors to thin film structures". Thin Solid Films 409 (2002) 138-146.*
Ricci, Anthony, "Point of Use (POU) Gas Purification for Atomic Layer Deposition (ALD) Processes". Pall Microelectronics Application Bulletin, ABG-105-0305, pp. 1-3, no date available.*
Chen, F. at aL. "A Comparative Study of ULK Conduction Mechanisms and TDDB Characteristics for Cu Interconnects with and without CoWP Metal Cap at 32-nm Technology", *IBM and Lam Research Corp.*, Paper # 7.3 IEEE IITC Conference Mar. 26, 2010, 1 pg.
Yang, Chih-Chao et al., "Co Capping Layers for Cu/Low-k Interconnects", *Microelectronic Engineering*, vol. 92 27th Annual Advanced Metalization Conference 2010 , pp. 79-82.

* cited by examiner

*Primary Examiner* — Bret Chen
(74) *Attorney, Agent, or Firm* — Servilla Whitney LLC

(57) ABSTRACT

Method for selectively depositing an atomic layer deposition film on a substrate having two different surfaces are generally described. More specifically, methods for depositing TaN selectively onto one or more of a dielectric or metal versus the other of a dielectric of metal.

20 Claims, 2 Drawing Sheets

SELECTIVE ATOMIC LAYER DEPOSITIONS

TECHNICAL FIELD

The present invention relates generally to methods of selectively depositing thin films by atomic layer deposition. In particular, the invention methods for selectively depositing thin films onto one of a dielectric or metal surface.

BACKGROUND

Deposition of thin films on a substrate surface is an important process in a variety of industries including semiconductor processing, diffusion barrier coatings and dielectrics for magnetic read/write heads. In the semiconductor industry, in particular, miniaturization requires atomic level control of thin film deposition to produce conformal coatings on high aspect structures. One method for deposition of thin films with atomic layer control and conformal deposition is atomic layer deposition (ALD), which employs sequential, surface reactions to form layers of precise thickness controlled at the Ångstrom or monolayer level. Most ALD processes are based on binary reaction sequences which deposit a binary compound film. Each of the two surface reactions occurs sequentially, and because they are self-limiting, a thin film can be deposited with atomic level control. Because the surface reactions are sequential, the two gas phase reactants are not in contact, and possible gas phase reactions that may form and deposit particles are limited. The self-limiting nature of the surface reactions also allows the reaction to be driven to completion during every reaction cycle, resulting in films that are continuous and pinhole-free.

ALD has been used to deposit metals and metal compounds on substrate surfaces. $Al_2O_3$ deposition is an example of a typical ALD process illustrating the sequential and self-limiting reactions characteristic of ALD. $Al_2O_3$ ALD conventionally uses trimethylaluminum (TMA, often referred to as reaction "A" or the "A" precursor) and $H_2O$ (often referred to as the "B" reaction or the "B" precursor). In step A of the binary reaction, hydroxyl surface species react with vapor phase TMA to produce surface-bound $AlOAl(CH_3)_2$ and $CH_4$ in the gas phase. This reaction is self-limited by the number of reactive sites on the surface. In step B of the binary reaction, $AlCH_3$ of the surface-bound compound reacts with vapor phase $H_2O$ to produce AlOH bound to the surface and $CH_4$ in the gas phase. This reaction is self-limited by the finite number of available reactive sites on surface-bound $AlOAl(CH_3)_2$. Subsequent cycles of A and B, purging gas phase reaction products and unreacted vapor phase precursors between reactions and between reaction cycles, produces $Al_2O_3$ growth in an essentially linear fashion to obtain the desired film thickness.

During the manufacture of integrated circuits, there is often a need to deposit films onto dielectric surfaces while avoiding exposed metal regions, and vice versa. For example, there may be copper on the bottom of a via that has low-k dielectric sidewalls. Thus, there is a need for a method of selectively depositing a film on a dielectric surface while avoiding deposition on a metal surface, and vice versa.

SUMMARY

Some embodiments of the invention are directed to methods of processing a substrate having a metal layer and a dielectric layer. The substrate is exposed to a first precursor that deposits a partial deposition layer on the metal layer and the dielectric layer by a first reaction. The partial deposition layer is exposed to a reaction byproduct that selectively reverse the first reaction substantially removing the partial deposition layer from one of the metal layer and the dielectric layer. The substrate is exposed to a second precursor that reacts with the partial layer on the dielectric layer to form a film by a second reaction. In one or more embodiments, these steps are sequentially repeated.

Additional embodiments of the invention are directed to methods of processing a substrate having metal layer and a dielectric layer. The substrate is exposed to a first precursor, a reaction byproduct and a second precursor to deposit a film on the one of the metal layer or the dielectric layer and substantially no film on the other of the metal layer and the dielectric layer. In some embodiments, the substrate is exposed to the reaction byproduct before being exposed to the second precursor. In some embodiments, the substrate is exposed to the second precursor before being exposed to the reaction byproduct.

In some embodiments, the reaction byproduct comprises a product of the first reaction. In one or more embodiments, the reaction byproduct comprises a product of a reaction different from the first reaction.

In some embodiments, exposing the partial deposition layer to the reaction byproduct substantially removes the partial deposition layer from the metal layer.

In some embodiments, the first precursor comprises a tantalum-containing compound. In one or more embodiments, the tantalum-containing compound comprises pentakis(dimethylamino)tantalum (PDMAT).

In some embodiments, the reaction byproduct comprises an amine. In one or more embodiments, the amine comprises dimethylamine (DMA).

In some embodiments, the film comprises tantalum nitride (TaN). In one or more embodiments, less than 10 angstroms of TaN are deposited.

Further embodiments of the invention are directed to methods of forming a tantalum nitride barrier on a substrate comprising a metal layer and a dielectric layer. The substrate is exposed to a first precursor comprising a tantalum-containing compound to form a partial film on the metal layer and the dielectric layer. The partial film is exposed to a reaction byproduct to selectively remove substantially all of the partial film from one of the metal layer and the dielectric layer and remove substantially none of the partial film from the other of the metal layer and the dielectric layer. The partial film is exposed to a second precursor comprising a nitrogen-containing compound to form the tantalum nitride barrier.

In some embodiments, the first precursor comprises pentakis(dimethylamino)tantalum (PDMAT), the reaction byproduct comprises dimethylamine (DMA) and the second precursor comprises ammonia. In some embodiments, the substrate is repeatedly exposed to the first precursor, reaction byproduct and second precursor to form a film having a thickness less than about 10 angstroms.

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

The ability to selectively deposit barrier layer materials (for example) on either Cu or low-k dielectric materials in back end-of-line (BEOL) applications can significantly improve the efficiency of processing as well as performance of devices. As used in this specification and the appended claims, the term "dielectric" is used to refer to any dielectric material, including low-k and high-k dielectrics and oxides. In one example, selective Co deposition has been demonstrated using a CVD approach to significantly improve electromigration performance of the BEOL wiring due to an improved interface adhesion between the different Cu layers. In another example, ECD CoWP has been deposited to achieve the same effect.

Figure 1:
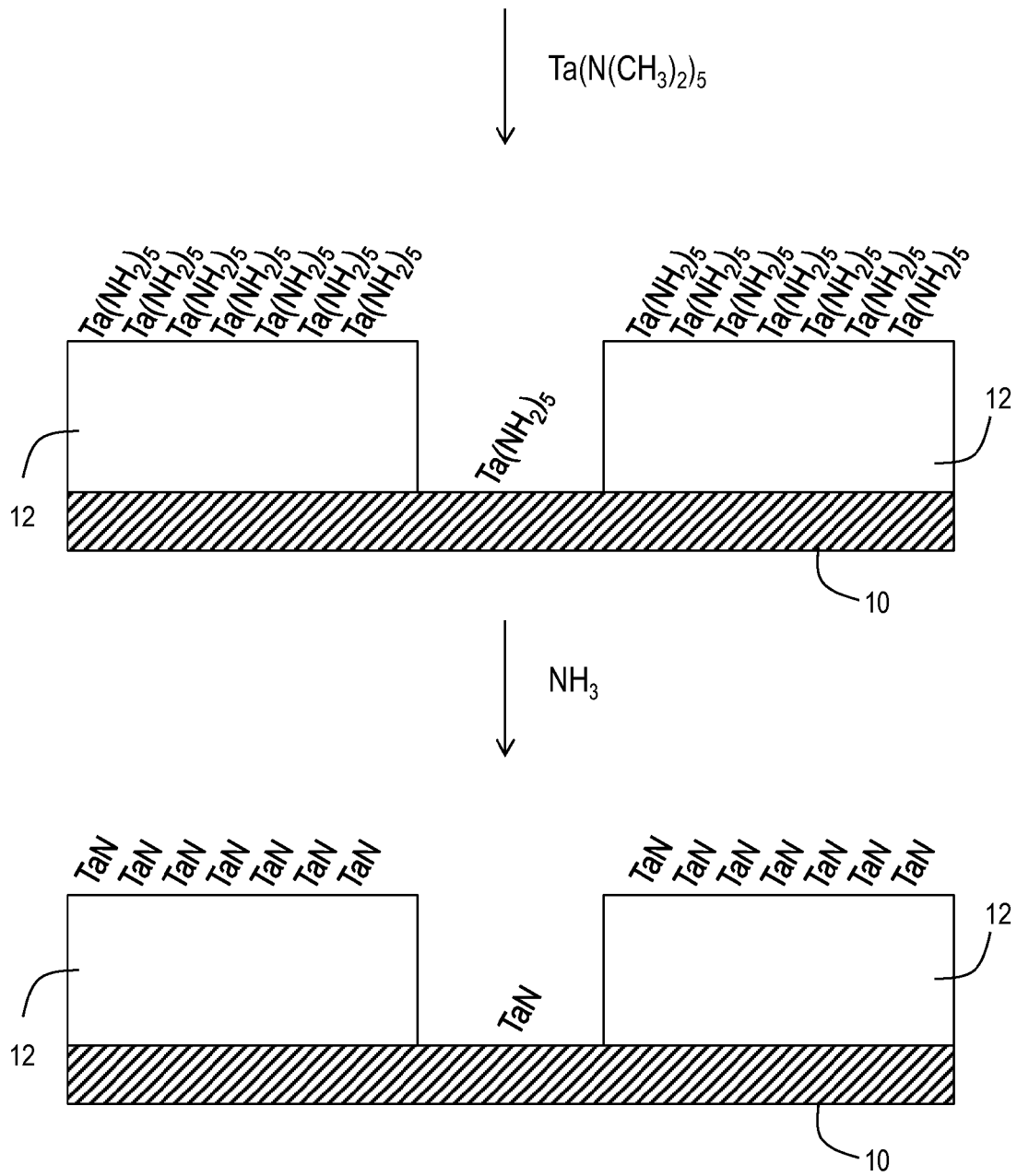
FIG. 1 is an illustration of a generic ALD process for depositing TaN.

FIG. 1 shows a typical ALD process for the deposition of a TaN film on a substrate 10 with dielectric films 12. The substrate 10 can be any suitable material including a layer which has already been deposited. In the example shown, the substrate 10 is exposed to pentakis(dimethyl-amino)tantalum (PDMAT) which forms deposits onto the surface as an intermediate. The intermediate shown in FIG. 1 is $Ta(NH_2)_5$, however, it will be understood by those skilled in the art that there are many potential intermediate species which can be formed and the identity of the intermediate can be different or unknown. The intermediate has formed mostly on the dielectrics 12 with very little on the substrate 10 as the bottom of a via. Without being bound by any particular theory of operation, it is believed that this is at least partially due to different chemisorptions energies for these two surfaces, favoring formation on the dielectrics 12 over the substrate 10.

The substrate 10 and dielectrics 12 with the intermediate species thereon is then exposed to a second precursor, shown here as ammonia ($NH_3$). The second precursor reacts with the intermediate on the surfaces and forms a tantalum nitride (TaN) film. Again, it can be seen that a small amount of TaN forms on the bottom of the via because there was a small amount of the tantalum intermediate present in that region.

For via resistances, the goal is to have minimal high resistivity material at the bottom of the vias. To achieve this, it would be ideal to have barrier materials that selectively deposits on the dielectric to protect the dielectric from Cu diffusion, and vice versa (the Cu from oxygen diffusion) while no deposition occurs on the bottom Cu surface. Embodiments of the invention can help to achieve the goal of selective barrier deposition on dielectrics versus Cu or metallic surfaces.

Figure 2:
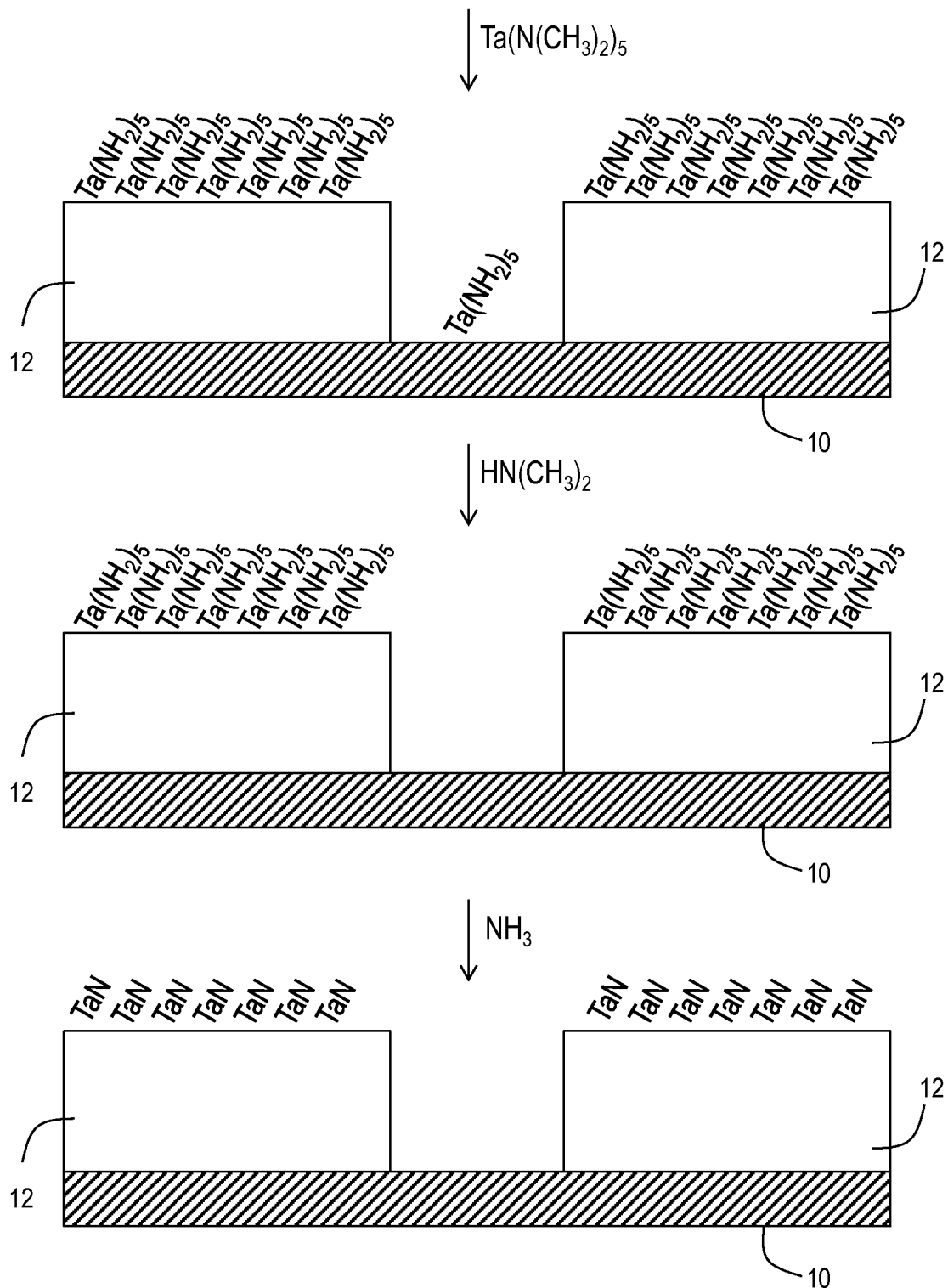
FIG. 2 is an illustration of a selective ALD process for depositing TaN in accordance with one or more embodiments of the invention.

With reference to FIG. 2, in some embodiments, the ALD of TaN from PDMAT can have selective behavior on dielectrics 12 vs. substrate 10 (e.g., a copper surface). By utilizing the differences in chemisorptions energies on the different substrates, the use of reaction byproducts (e.g., dimethylamine in the case of PDMAT) to drive the removal of precursors from surfaces at different rates may lead to selective deposition on dielectrics vs. copper surface. The substrate 10 and dielectrics 12 are exposed to a first precursor resulting in the formation of an intermediate on these surfaces. Following a self-limiting precursor exposure, the byproducts of the reaction (e.g., dimethylamine) can be delivered to the surface to drive the reverse reaction, removing the precursors from the surface. Without being bound by any particular theory of operation, it is believed that the removal of precursors from the surface will also be driven by the chemisorptions energies, and removal will occur at different rates for the different surfaces. This will lead to a disproportionate amount of precursor absorbed on the dielectrics 12 versus the metal (e.g., copper) surface, as shown in the middle of FIG. 2. Further exposure to a second precursor completes the ALD reaction, leaving a film deposited selectively on the dielectrics vs. the substrate. Some embodiments of the invention can be applied to other systems where the ALD precursors are simultaneously exposed to different substrate surfaces.

Accordingly, some embodiments of the invention are directed to methods of processing a substrate having at least two different layers. While the different layers are referred throughout as a substrate and dielectric, it will be understood by those skilled in the art that the different layers can be any different layers. For example, a substrate and a metal, or a metal and a dielectric, or a substrate, metal and dielectric. It is believed that embodiments of the invention are useful where there is a difference in the chemisorptions of the precursors to the surfaces.

Some embodiments of the invention are directed to methods of processing a substrate having a metal layer and a dielectric layer. As used in this specification and the appended claims, the term "substrate" refers to a surface upon which something is being deposited and is not limited to a single rigid substrate like a silicon wafer. The substrate is exposed to a first precursor to deposit a partial deposition layer on the metal layer and the dielectric layer by a first reaction. The first reaction resulting in an intermediate species being deposited on the metal surface and dielectric surface based in part on the chemisorptions energies of these surfaces. The reaction of the precursor and the surface results in an intermediate on the surface and a byproduct, as shown in the generic Equations IA and IB. The reactions are illustrated with double arrows indicating that the reaction conditions are reversible and that an equilibrium can be established.

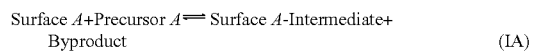

$$\text{Surface } A + \text{Precursor } A \rightleftharpoons \text{Surface } A\text{-Intermediate} + \text{Byproduct} \quad (IA)$$

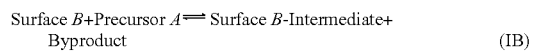

$$\text{Surface } B + \text{Precursor } A \rightleftharpoons \text{Surface } B\text{-Intermediate} + \text{Byproduct} \quad (IB)$$

Because surface A and surface B have different properties, including chemisorptions, the amount Surface A-Intermediate and Surface B-Intermediate formed will likely differ. The reaction with the higher equilibrium constant will belong to the preferential surface for this reaction. The reaction byproduct can then be added to the system exposing the partial deposition layer to the byproduct to drive the equilibrium toward the reactants. This is also referred to as an etch step. The reaction with the lower equilibrium constant will have the higher equilibrium constant for the reverse reaction and the first reaction can be selectively reversed. substantially removing the partial deposition layer from one of the metal layer and the dielectric layer (i.e., Surface A and Surface B). As used in this specification and the appended claims, the term "substantially removing" means that at least about 75% of the amount of the partial layer is removed. In some embodiments, "substantially removing" means that at least about 80%, 85%, 90% or 95% of the partial layer is removed.

The substrate or surface is then exposed to a second precursor to complete the ALD reaction as illustrated in Equation II. The second precursor reacts with the partial layer remaining on the dielectric layer (or Surface A) or the metal layer (Surface B) to form a film by a second reaction.

$$\text{Surface-Intermediate+Precursor } B \rightarrow \text{ALD layer} \qquad \text{(II)}$$

This complete process, exposure to a first precursor, byproduct and second precursor results in a single ALD layer being formed. An ALD film generally is made up of more than one deposited layer. Thus, a substrate can be sequentially exposed to the first precursor and the second precursor. In some embodiments, the exposure to these steps (first precursor, byproduct, second precursor) is sequentially repeated. The number of times that the sequence is repeated depends on the desired film thickness. For example, a 5 Å thick film might require 10 ALD cycles with each cycle being represented by a single exposure to the first precursor and a single exposure to the second precursor. In some embodiments, the thickness of the film formed is less than about 200 Å, 100 Å, 75 Å 50 Å, 40 Å, 30 Å, 25 Å, 20 Å, 15 Å, 10 Å or 5 Å. The number of process cycles in some embodiments, is less than about 400, 200, 150, 100, 80, 60, 50, 40, 30, 20 or 10.

In some embodiments, the first precursor comprises a tantalum-containing compound. The tantalum-containing compound can be any suitable compound for use in ALD reactions. Exemplary tantalum precursors include pentakis (dimethylamino) tantalum (PDMAT, $(Me_2N)_5Ta$), pentakis (diethylamino)tantalum (PDEAT, $(Et_2N)_5Ta$), pentakis (ethylmethylamino)tantalum (PEMAT, $(EtMeN)_5Ta$), tert-butylimino tris(dimethylamino)tantalum (TBTDMT, $(t\text{-BuN})Ta(NMe_2)_3$), tert-butylimino tris(diethylamino)tantalum (TBTDET, $(t\text{-BuN})Ta(NEt_2)_3$), tert-butylimino tris (ethylmethylamino)tantalum (TBTEMT, $(t\text{-BuN})Ta(NMeEt)_3$), tert-amylimino-tris(dimethylamino)tantalum (TAIMATA, $(t\text{-AmylN})Ta(NMe_2)_3$), tert-amylimino-tris(diethylamino)tantalum $((t\text{-AmylN})Ta(NEt_2)_3)$, tert-amylimino-tris(ethylmethylamino)tantalum $((t\text{-AmylN})Ta(NEtMe)_3)$, bis(cyclopentadienyl)tantalum trihydride $(Cp_2TaH_3)$, bis(methylcyclopentadienyl)tantalum trihydride $((MeCp)_2TaH_3)$, bis(pentamethylcyclopentadienyl)tantalum trihydride $((Me_5Cp)_2TaH_3)$, tantalum methoxide $((MeO)_5Ta)$, tantalum ethoxide $((EtO)_5Ta)$, tantalum propoxide $((PrO)_5Ta)$, tantalum butoxide $((BuO)_5Ta)$, isomers thereof, or derivatives thereof. In some embodiments, the tantalum-containing compound comprises pentakis(dimethylamino) tantalum (PDMAT).

The byproduct used in the etching step can be any suitable byproduct. For example there may be an etch reaction that is more selective for the layer being deposited than the reverse of the first reaction. In this case, a separate etch reaction may be used. Although the term "reaction byproduct" is used to describe the etch reagent, it will be understood by those skilled in the art that the reaction byproduct can be a byproduct related to the primary reaction products. In some embodiments, the reaction byproduct is a product of the first reaction. In some embodiments, the reaction byproduct comprises a product of a reaction different from the first reaction. For example, if dimethylamine is the primary product of the reaction, trimethylamine may be used in the reverse reaction even though it is not the primary reaction byproduct. In some embodiments, the reaction byproduct comprises an amine. In some embodiments, the amine is one or more of dimethylamine (DMA), trimethylamine (TMA), diethylamine (DEA) and triethylamine (TEA).

In some embodiments, the surfaces upon which deposition is intended include a metal layer and a dielectric layer. In some embodiments, exposing the partial deposition layer to the reaction byproduct substantially removes the partial deposition layer from the dielectric layer. In some embodiments, exposing the partial deposition layer to the reaction byproduct substantially removes the partial deposition layer from the metal layer. In some embodiments, exposing the partial deposition layer to the reaction byproduct substantially removes the partial deposition layer from a bare substrate. Specific surface include, but are not limited to, metal surfaces (e.g., copper and aluminum), dielectrics (e.g., silicon dioxide), carbon-doped oxides and low-k dielectric films.

The film formed by the claimed processes can be any suitable ALD film In some embodiments, the film comprises tantalum nitride (TaN). The tantalum nitride film may have particular use as a copper barrier in back end-of-line (BEOL) processes.

In one or more embodiments, a TaN film is deposited by exposing the substrate, and surfaces thereon, to a first reaction gas comprising PDMAT, a reaction byproduct comprising DMA and a second reaction gas comprising ammonia to form the film. In some embodiments, less than about 10 angstroms of TaN are deposited onto a dielectric surface.

Additional embodiments of the invention are directed to methods of processing a substrate having a metal layer and a dielectric layer. The substrate is exposed to a first precursor, a reaction byproduct and a second precursor to deposit a film on the one of the metal layer or the dielectric layer and substantially no film on the other of the metal layer and the dielectric layer. As used in this specification and the appended claims, the term "substantially no film" means that there is less than about 5% of the film formed on the surface compared to the other surface that a film is formed on. For examples, if the film is intended to be formed on the dielectric, then "substantially no film" is formed on the metal layer (or other layer).

The order of exposing the substrate to the reaction byproduct and the first and second precursors may be variable. In some embodiments, the substrate is exposed to the reaction byproduct before being exposed to the second precursor. In some embodiments, the substrate is exposed to the second precursor before being exposed to the reaction byproduct.

Further embodiments of the invention are directed to methods of forming a tantalum nitride barrier on a substrate comprising a metal layer and a dielectric layer. The substrate is exposed to a first precursor comprising a tantalum-containing compound to form a partial film on the metal layer and the dielectric layer. The partial film is exposed to a reaction byproduct to selectively remove substantially all of the partial film from one of the metal layer and the dielectric layer and remove substantially none of the partial film from the other of the metal layer and the dielectric layer. The partial film is exposed to the second precursor comprising a nitrogen-containing compound to form the tantalum nitride barrier.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A method of processing a substrate having a metal layer and a dielectric layer, the method comprising:
   (a) exposing the substrate to a first precursor to deposit a partial deposition layer on the metal layer and the dielectric layer by a first reaction;
   (b) exposing the partial deposition layer to a reaction byproduct to selectively reverse the first reaction substantially removing the partial deposition layer from one of the metal layer and the dielectric layer; and
   (c) exposing the substrate to a second precursor to react with the partial layer on the metal layer or dielectric layer to form a film by a second reaction.

2. The method of claim 1, further comprising sequentially repeating steps (a)-(c).

3. The method of claim 1, wherein the reaction byproduct comprises a product of the first reaction.

4. The method of claim 1, wherein the reaction byproduct comprises a product of a reaction different from the first reaction.

5. The method of claim 1, wherein exposing the partial deposition layer to the reaction byproduct substantially removes the partial deposition layer from the metal layer.

6. The method of claim 1, wherein the first precursor comprises a tantalum-containing compound.

7. The method of claim 6, wherein the tantalum-containing compound comprises pentakis(dimethylamino) tantalum (PDMAT).

8. The method of claim 7, wherein the reaction byproduct comprises an amine.

9. The method of claim 8, wherein the amine comprises dimethylamine (DMA).

10. The method of claim 7, wherein the film comprises tantalum nitride (TaN).

11. The method of claim 10, wherein less than 10 angstroms of TaN are deposited.

12. A method of processing a substrate having a metal layer and a dielectric layer, the method comprising exposing the substrate to a first precursor, a reaction byproduct and a second precursor to deposit a film on one of the metal layer or the dielectric layer and substantially no film on the other of the metal layer and the dielectric layer.

13. The method of claim 12, wherein the substrate is exposed to the reaction byproduct before being exposed to the second precursor.

14. The method of claim 12, wherein the substrate is exposed to the second precursor before being exposed to the reaction byproduct.

15. The method of claim 12, wherein the first precursor comprises a tantalum-containing compound.

16. The method of claim 15, wherein the reaction byproduct comprises an amine.

17. The method of claim 16, wherein the film comprises tantalum nitride (TaN).

18. A method of forming a tantalum nitride barrier on a substrate comprising a metal layer and a dielectric layer, the method comprising:
   exposing the substrate to a first precursor comprising a tantalum-containing compound to form a partial film on the metal layer and the dielectric layer;
   exposing the partial film to a reaction byproduct to selectively remove substantially all of the partial film from one of the metal layer and the dielectric layer and remove substantially none of the partial film from the other of the metal layer and the dielectric layer; and
   exposing the partial film to a second precursor comprising a nitrogen-containing compound to form the tantalum nitride barrier.

19. The method of claim 18, wherein the first precursor comprises pentakis(dimethylamino) tantalum (PDMAT), the reaction byproduct comprises dimethylamine (DMA) and the second precursor comprises ammonia.

20. The method of claim 19, wherein the substrate is repeatedly exposed to the first precursor, reaction byproduct and second precursor to form a film having a thickness less than about 10 angstroms.

* * * * *